US005631588A

United States Patent [19]

Bertolini

[11] Patent Number: 5,631,588

[45] Date of Patent: May 20, 1997

[54] POWER OUTPUT STAGE WITH LIMITED CURRENT ABSORPTION DURING HIGH-IMPEDANCE PHASE

[75] Inventor: Luca Bertolini, Milan, Italy

[73] Assignee: SGS-Thomson Microelectronics, S.r.l., Agrate Brianza, Italy

[21] Appl. No.: 236,227

[22] Filed: Apr. 29, 1994

[30] Foreign Application Priority Data

Mar. 29, 1994 [EP] European Pat. Off. .............. 94830148

[51] Int. Cl.$^6$ .......................... H05B 41/14; H03K 17/687

[52] U.S. Cl. .......................... 327/108; 327/584; 327/111; 327/112; 327/421; 327/423; 327/483; 327/365; 326/82

[58] Field of Search .................................. 326/82, 85, 87, 326/89, 91; 327/437, 382, 388, 389, 584, 365, 409, 421, 423, 424, 575, 483, 546, 387, 111, 112, 108

[56] References Cited

U.S. PATENT DOCUMENTS 5,068,571 11/1991 Schoofs .................................. 315/205
5,204,562 4/1993 Pace ........................................ 322/382
5,376,832 12/1994 Gariboldi et al. ........................ 327/108

FOREIGN PATENT DOCUMENTS 409328 1/1991 European Pat. Off. .

*Primary Examiner*—Timothy P. Callahan
*Assistant Examiner*—Dinh T. Le
*Attorney, Agent, or Firm*—Robert Groover; Betty Formby

[57] ABSTRACT

A power stage of quasi-complementary symmetry, including a common-source FET and a common-drain FET, with a reduced absorption of current under the conditions of high impedance of the output. The driving node of the upper (common-drain) transistor from is decoupled from the output node of the stage, preventing the current generator Id, which discharges the control node, from absorbing current from the load connected to the output stage, during a phase of high output impedance. This is preferably realized by using a field effect transistor which has its gate connected to the output node of the stage, and is connected to provide the current drawn from the discharge generator of the driving node of the upper common-drain transistor, absorbing it from the supply node VDD instead of absorbing it from the voltage overdriven node Vb. This alternative solution avoids excessive loading of the high-voltage supply, and is particularly useful when the overdriven node Vb drives multiple output stages.

64 Claims, 4 Drawing Sheets

POWER OUTPUT STAGE WITH LIMITED CURRENT ABSORPTION DURING HIGH-IMPEDANCE PHASE

CROSS-REFERENCE TO RELATED APPLICATION

This application claims priority from European app'n 94830148.6, filed Mar. 29, 1994, which is hereby incorporated by reference.

BACKGROUND AND SUMMARY OF THE INVENTION

The present invention generally concerns circuits for controlling power field-effect transistors (FETs), and particularly a power stage of quasi-complementary symmetry, i.e. a stage which includes a first transistor in common-source configuration and a second transistor in common-drain configuration, for driving loads of mixed type.

Half-bridge power stages are commonly used for driving brushless motors, stepper motors, and for transmitting logic signals at high-voltage. When the fabrication technology permits, it is preferable to utilize field effect transistors for the output, for example, VDMOS (Vertical Double Diffused MOS transistors) or LDMOS (Lateral Double Diffused MOS transistors), since these provide significant advantages over bipolar transistors of comparable current-carrying capacity. In a typical half-bridge stage, the two transistors of the stage are connected in series between the two power supply nodes, and are driven alternatively into conduction by appropriate control circuits which are coupled to their gate terminals.

While it is possible to use a complementary pair of output transistors (i.e. PMOS and NMOS), this solution is seldom used because a greater area is required for a PMOS transistor. (As is well known, for a PMOS transistor the ratio between the internal on-resistance Ron and the area required is more than double the ratio for a comparable NMOS transistor). The necessity to minimize the area conversely favors the use of a pair of output transistors which are both N-channel, to realize a power stage which is of quasi-complementary symmetry including a first transistor (or stage) in common-source configuration, at an output node of which a second transistor (stage) in common-drain configuration is connected.

As is well known, a common-drain stage (or transistor) requires a gate drive potential (Vb) which is higher than the common potential of the drain (VDD), in order to assure a suitable turn-on. Such an elevated drive voltage Vb is commonly generated within the integrated circuit, by means of a voltage-multiplying circuit.

Moreover, the load driven by a half-bridge power stage will almost always be a reactive load, and often will have "mixed" characteristics. For example, in the case of electric motors, the load acts like a capacitive load at start-up, but while the velocity is being regulated (i.e. in phases where reactive current is being recirculated), the load behaves like an inductor.

In the presence of capacitive loads (voltage inertial loads), it is necessary to protect the pull-up transistor from the inevitable voltage spikes which may cause the gate/source breakdown voltage to be exceeded (particularly in view of the overdriven gate of the common-drain-configured transistor). This protection function is commonly handled by at least one pair of back-to-back zener diodes, connected between the gate and source of the transistor which is overdriven by the high voltage Vb on its gate.

This problem does not exist for the other power transistor, since the source of this other transistor is always held at a common potential (ground potential usually).

The two FIGS. 1A and 1B show a typical circuit configuration for a half-bridge power stage, which includes a pair of FETs M1 and M2. The upper transistor (M2) is overdriven by a gate voltage Vb which is higher than its drain voltage VDD. The drive of the transistor M2 is commanded by a pair of signals SWD and SWS, which are respectively connected to charge and to discharge the gate node of the transistor M2, by means of respective current generators Is and Id.

FIG. 1A shows the case of a capacitive load. In this operating regime, the zener diodes D1 and D2 limit the gate-source voltage VGS of the transistor M2, when it is turned on in the presence of voltage inertial loads (capacitive load CL). When the zener protection diodes D1 and D2 are turned on, they can carry current Is, with forward and reverse bias respectively.

In an inductive load condition, as shown in FIG. 1B, the zener protection diodes D1 and D2 limit (in the opposite direction) the maximum gate-source voltage VGS of the transistor M2 (which in the illustrated phase is off), while the transistor M1 makes the transition from on-state to off-state. These conditions may be seen, for example, during the speed-regulation of an electric motor. Under such conditions, due to the effect of the current Io which flows through the inductive load (discharge current of the energy stored in the inductance Ll), and across the recirculation diode D3 intrinsic to the integrated structure of the FET M2, the output voltage Vo rises to a value given by:

$$Vo=VDD+V_{D3},$$

which is a value higher than the supply voltage VDD. The zener diodes D1 and D2 are therefore turned on and carry current Id, in forward and reverse bias current directions respectively.

Under these conditions, a current Ilo equal to Id is absorbed at the output node Vo. This current absorption across the output node of the power stage begins when the output voltage Vo exceeds a threshold value given by:

$$Vo_t=V_{D2}+Vz,$$

where $V_{D2}$ is the drop across forward biased zener D2 and Vz is the zener voltage of the diode D1. Therefore the threshold value $Vo_t$ is necessarily less than the maximum value of the output voltage Vo.

This current Ilo (due to the presence of the zener diodes for protection of the common-drain-configured transistor), is absorbed under conditions of high output impedance, and introduces some imprecision in the current which flows through the load. Indeed, during the phases of recirculation (with M2 off), and when the voltage of the output node exceeds the threshold voltage ($Vo>V_{D2}+Vz$), the circuit absorbs a current Id from the load through the protection diodes D1 and D2.

This current absorption changes the time constant for discharge of the inductance, and introduces therefore an imprecision which may be intolerable in many applications.

Another drawback is represented by the fact that, during testing of the integrated circuits, the presence of the current absorbed at the output node may obstruct verification of the high-voltage integrity of the common-source connected transistor (M1). Indeed, the absorption of current across the protective diodes D1 and D2 prevents determination of absorption due to possible leakage current into the substrate of the transistor M1.

It is therefore a primary object of the present invention to provide a power stage of quasi-complementary symmetry, including a common-source FET and a common-drain FET, with a reduced absorption of current under the conditions of high impedance of the output.

This objective is effectively obtained by substantially decoupling the driving node of the upper (common-drain) transistor from the output node of the stage. This prevents the current generator Id, which discharges the control node, from absorbing current from the load connected to the output stage, during a phase of high output impedance, and when the inertial swing of voltage on the output node exceeds the threshold value which causes turn on of the zener protection diodes connected between the output node of the stage and the control node of the upper (common-drain) transistor.

An effective decoupling may be realized by using a bipolar transistor which has its base connected to the output node of the stage, and is connected to provide the current drawn from the discharge generator of the driving node of the upper common-drain transistor, absorbing it from the high-voltage overdriven supply node. In practice, the current absorbed from the load turns out to be a fraction of the current from the discharge current generator, in a relation given by the current gain of the decoupling transistor. Therefore, the decoupling transistor may be realized by a transistor of high gain, or alternatively by a Darlington stage.

To absorb the current drawn by the discharge generator from the node at overdriven voltage might be considered as a drawback in some applications, because this overdriven voltage is usually provided by a charge pump or voltage multiplier, which has a limited current capacity. To this end, it may also be considered that during the absorption, the overdriven transistor is off, and hence momentarily does not require overdriving from the high voltage.

According to an alternative embodiment of the invention, even this possible disadvantageous aspect is superseded by providing circuitry for absorbing the necessary current from the supply node VDD instead of absorbing it from the voltage overdriven node Vb. This alternative solution is particularly useful when the overdriven node Vb drives multiple output stages.

According to this alternative embodiment of the invention, the decoupling is obtained by using a field effect transistor instead of a bipolar transistor. This permits absorption of the current directly from the supply line VDD in order to not overload the overdriven node Vb. By providing a FET instead of a bipolar transistor, the problem of saturation of the bipolar transistor, when connected to the supply line VDD, is avoided. Moreover, when a condition of saturation is seen, the drastic reduction of the bipolar transistor current gain (causing a losing of the capacity to effectively decouple the output node of the stage) is also avoided. Naturally, this problem, related to saturation, is not present when a FET transistor is used for decoupling, since saturation for a FET follows a purely resistive type of behavior of the transistor.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION

Figure 2A:
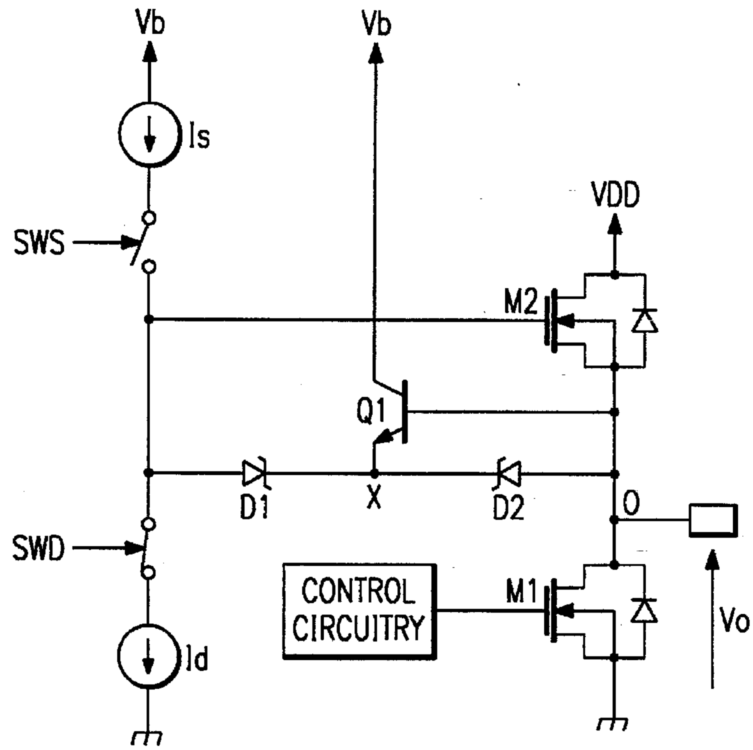
FIG. 2*a* shows a diagram of a power stage modified according to the present invention.

The numerous innovative teachings of the present application will be described with particular reference to the presently preferred embodiments (by way of example, and not of limitation), in which:

With reference to FIG. 2*a*, the additional bipolar transistor Q1 fills the function of decoupling the output node of the power stage from the generator Id when the output is into a high impedance condition (with M1 and M2 off).

Figure 1A:
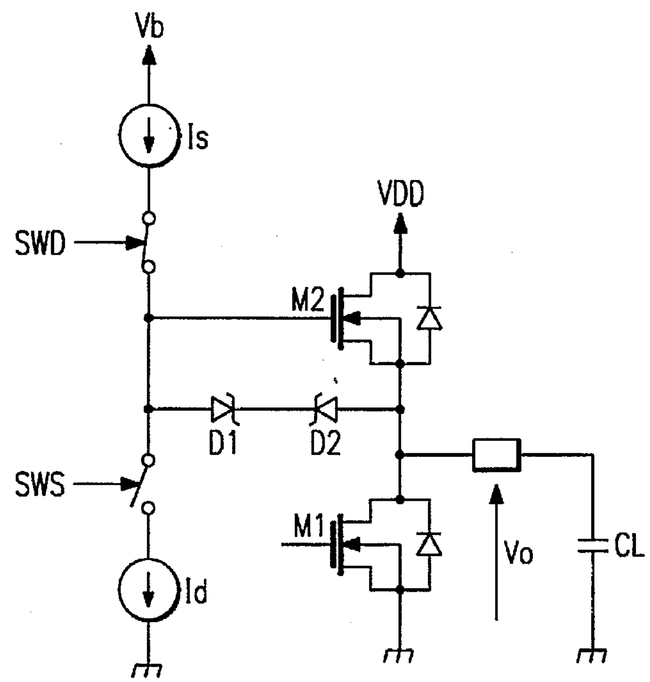
FIGS. 1A and 1B are simplified diagrams of a power stage. In particular, of a system for driving and for protection from overvoltages of the upper transistor in the common-drain configuration respectively in the case of a capacitive load and in the case of an inductive load, as described above.
Figure 1B:
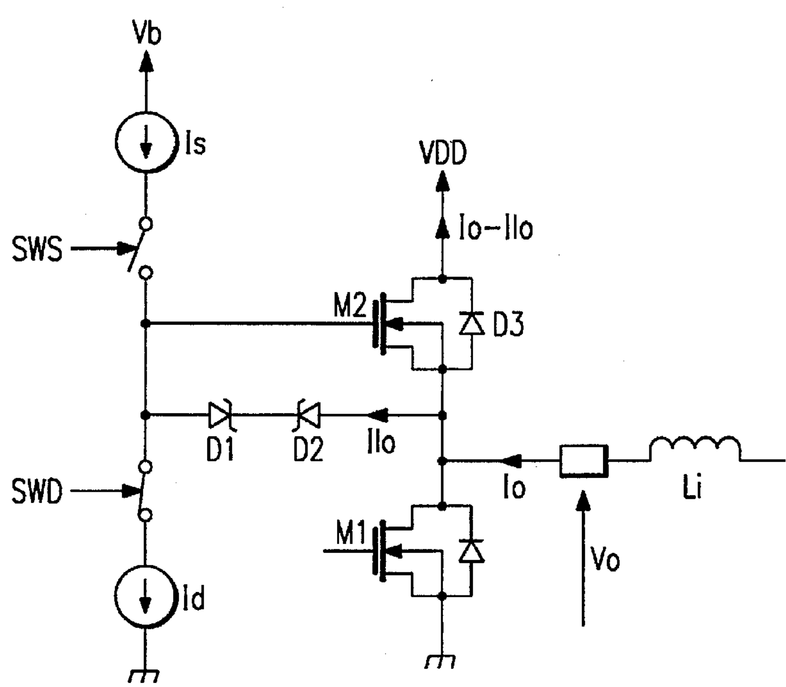

In this condition, when the voltage on the output node exceeds the limit value ($Vo>VDD+V_{D3}$) the zeners D1 and D2 turn on and receive the current Id, driven from the discharge generator of the gate node of the transistor M2. This current is supplied from the decoupling transistor Q1, which absorbs it from the high voltage node Vb. Meanwhile the absorption of current from the load (according to the scheme described in relation to FIG. 1*b*) will therefore be given by:

$$Ilo=Id/\beta_{Q1}.$$

Clearly this absorption can be reduced as much as necessary, by providing a decoupling transistor Q1 having an adequate current gain.

Figure 2B:
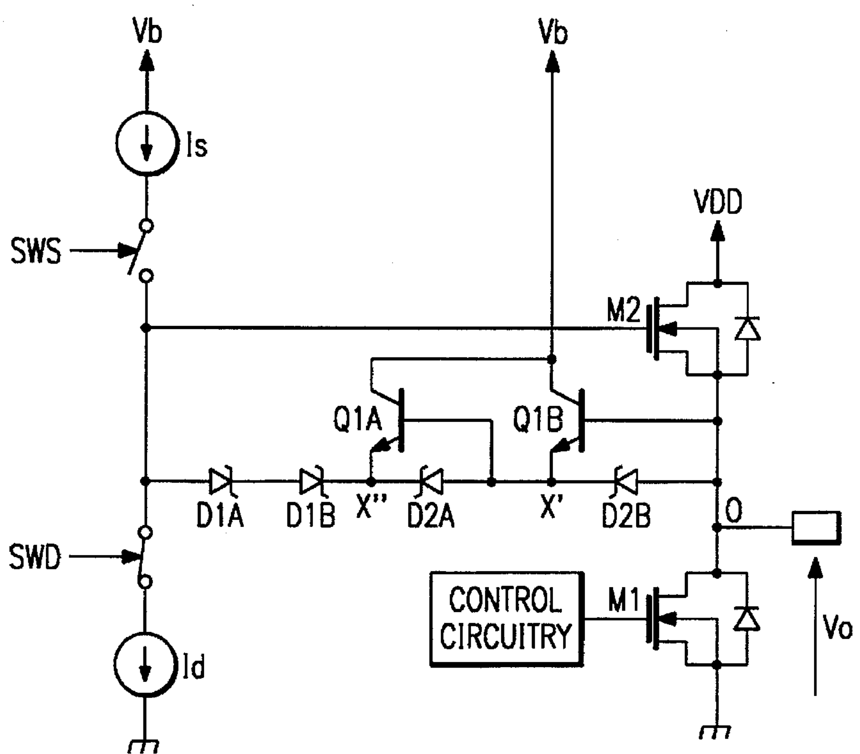
FIG. 2*b* shows an alternative embodiment of the invention, including a pair of transistors in Darlington configuration for decoupling.

Alternatively, as shown in FIG. 2*b*, a Darlington stage can be used, formed by a cascaded pair of transistors Q1A and Q1B, in which case the current therefore absorbed from the load is therefore given by $Ilo=Id/(\beta_{Q1})^2$.

In both these embodiments (of FIG. 2*a* or FIG. 2*b*), the base-emitter junction of the decoupling transistor Q1 (or of the decoupling transistors Q1A and Q1B), will be protected when reverse biasing occurs, by the presence of the zener diode D2 (or of D2A and D2B in the latter case).

According to the embodiment of FIG. 2*b*, using a Darlington stage, the two diodes D2A and D2B should each have a zener voltage equal to half the zener voltage necessary to effectively protect the gate-source junction of transistor M2. Naturally, diodes D1A and D1B may be alternatively replaced by a single zener diode having a zener voltage equal to the sum of the zener voltages of D1A and D1B (or of D2A and D2B).

Figure 2C:
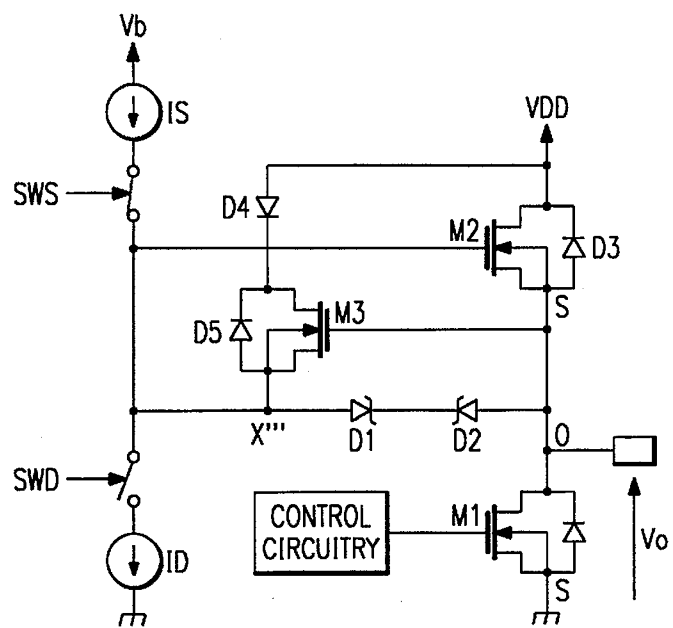
FIG. 2*c* shows a further alternative embodiment of the invention, which is effective to avoid loading of the high voltage driving node.

As noted above, current consumption from the high voltage node Vb may be avoided, in cases where this might be a problem, by using the alternative form of the invention shown in FIG. 2*c*.

According to this alternative embodiment, a field-effect transistor M3 is used for decoupling the output node of the stage from the generator Id, when, under conditions of high impedance of the output node (M1 and M2 off), the voltage on the output node exceeds a threshold voltage which in this case will be given by:

$$V_{gsM3}<Vz+Vbe$$

at current value Id provided from the discharge current generator of the node for driving the output transistor M2.

This condition may easily be established by appropriately selecting the channel size of transistor M3. A diode D4 is added in series with the decoupling transistor M3 to prevent the intrinsic diode D5 (which is intrinsic to the structure of the decoupling transistor M3) from turning on, while transistor M2 turns on, since this would short circuit the high voltage line Vb to the supply voltage line VDD.

This alternative solution avoids overloading the high voltage line Vb, and allows absorption of the current drawn from transistor Id directly from the supply node VDD.

In integrated circuits, the invention is particularly useful when zener diodes with a breakdown voltage Vz less than Vebo (breakdown voltage of the emitter-base junction with collector open of the bipolar decoupling transistor Q1) are available. Moreover, in all the situations in which such zener diodes are not available, the alternative solutions described in relation to FIG. 2*b* and 2*c* will overcome possible difficulties of implementation, because (in the case of the solution of FIG. 2*b*) the condition Vz<Vebo is always satisfied. In the case of the solution of FIG. 2*c*, obviously there is no need to protect any reverse biased junctions. In this case, the functionality of the arrangement is assured by the appropriate dimensioning of the MOS transistor M3 so as to preserve the relation $Vz<Vgs_{D3}$, to avoid an improper turn-on.

A sample illustrative implementation of the invention is in a half-bridge power stage, comprising two N-channel LDMOS transistors having W/L dimensions (in microns) between 20,000/4 and 40,000/4, for use with specified supply voltages VDD in the range between 10 and 18 volts. In this example, the upper transistor, connected in common-drain configuration, is overdriven with a high voltage Vb of about 25 volts. In such an output stage, the generator for discharging the driving node of the upper transistor may be configured to supply a discharge current Id of about 1 mA. According to the present invention, the NPN decoupling transistor Q1 (FIG. 2*a*) or the two NPN transistors cascaded to form a Darlington pair (FIG. 2*b*), may have relatively small sizes, substantially equivalent to the minimum dimension of the process. Even if a decoupling FET (M3) is provided, in order to not load the high voltage node (FIG. 2*c*), the transistor may have relatively small dimensions. In the case of an output stage with the characteristics indicated above, the decoupling FET may have dimensions (W/L) of, for example, between 20/4 and 50/4 in microns.

It may be seen that the circuit provided by the invention is extremely simple and very economical in terms of area requirements.

Figure 3A:
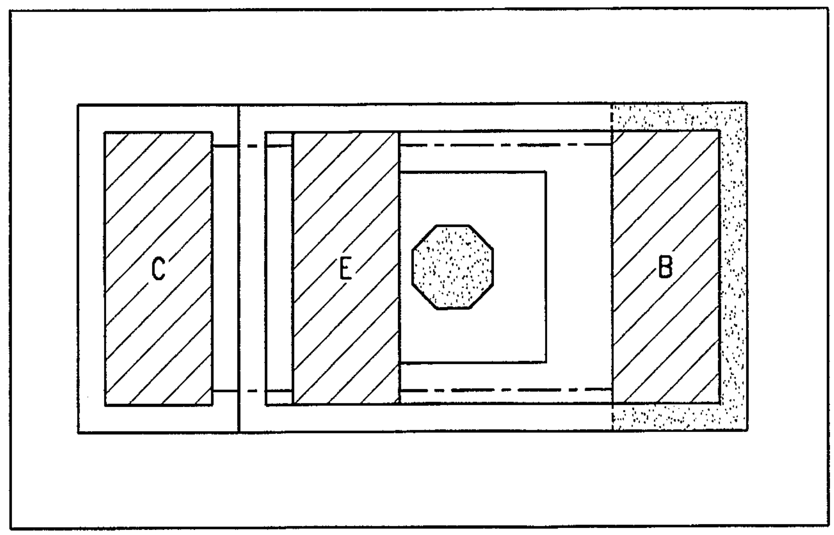
FIGS. 3*a* and 3*b* are respectively plan and section views of an integrated circuit structure of an embodiment of the invention according to FIG. 2.
Figure 3B:
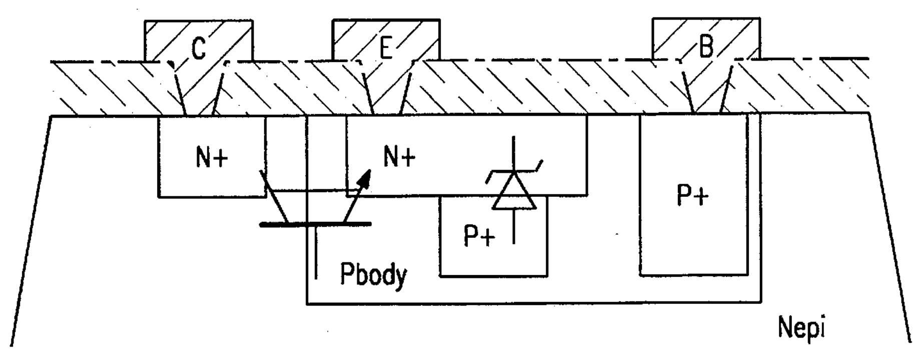

In the case of a solution as illustrated in FIG. 2*a*, implemented in an integrated circuit, an efficient integrated structure for the NPN decoupling transistor and for the zener protection diodes D2 is schematically illustrated in FIGS. 3*a* and 3*b*. The integrated structure is substantially that of a bipolar transistor of type NPN, in which the base emitter junction is protected by use of a deep P+ implant which allows the formation, with the N+ zone of the emitter, of a zener structure known as the "buried zener".

The collector terminal of the NPN transistor is represented by an epitaxial layer Nepi. For example, the P-body region may have a sheet resistance of 1000 ohms per square, the P+ regions may have a sheet resistance of 100 ohms per square, the N+ regions may have a sheet resistance of 40 ohms per square, and the epitaxial layer Nepi may have a sheet resistance of 2100 ohms per square.

Naturally, a composite structure of this type can be modified in various ways, by reflection, rotation, and translation of the active areas of the components (Q1 and D2). Thus the foregoing specific examples do not delimit the scope of the invention, which is defined only by the claims.

A further advantage obtained by the invention is the great simplicity of implementation of the drive circuit of the common-drain transistor M2.

In particular, the discharge current generator Id may be designed with elevated peak values, in order to assure a rapid turn-off of the transistor M2, without undesirably increasing the current absorbed from the output node, due to the decoupling obtained by the arrangement of the invention.

Sample IC Implementation

Figure 4:
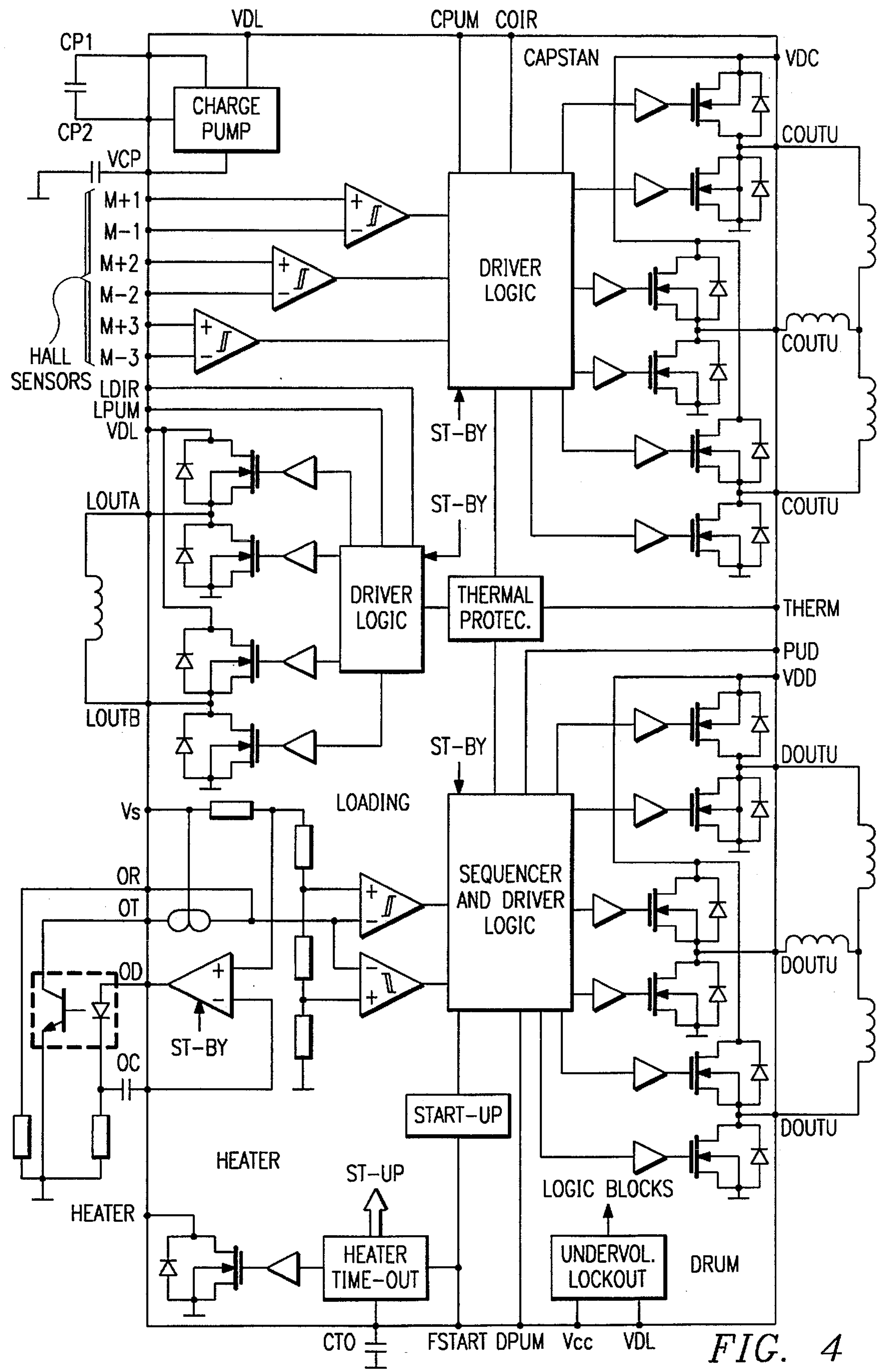
FIG. 4 shows a complete integrated circuit which advantageously incorporates the power driving innovations described above. (Of course, these innovations may also be incorporated into many other integrated circuits.)

FIG. 4 shows a complete integrated circuit which advantageously incorporates the power driving innovations described above. (Of course, these innovations may also be incorporated into many other integrated circuits.)

The F-VHS Motor Driver COMBO IC includes a double three phase brushless motor driver plus a DC full bridge motor driver for VCR application. These driver circuits include at least one of the power stages implemented according to the present invention and already described.

In this sample embodiment, the package is S-DIP 42 (38+2+2 pin ground frame). The device is realized in BCD technology with power LDMOS output stages. The gate drive for high side stages is provided by an internal charge pump with two external capacitors. The first three phase motor driver is devoted to the DRUM motor control.

The phase sequence update signal is provided initially by an external start-up signal 9FSTART), whose frequency is internally divided by four, while, during normal operation, is provided by an optical tacho-converter signal. This signal is used as clock and reset for the state machine.

The regulation of the speed is externally provided by means of PWM signal generated by the μP (9DPWM), without an external sensing resistor. The feedback to the μP unit is given by a suitable open drain output signal (PUD) synchronized by the internal state machine.

The second three phase motor driver is devoted to the CAPSTAN control. While the DRUM will always spin in a fixed direction, the CAPSTAN motor needs a more sophisticated logic to control the changes in spin direction.

The motor position detection is carried out by means of three comparators for Hall effect sensors. The loop regulation for this motor is still provided by the μP with the signals CPWM and CDIR.

The LOADING motor section include a full bridge DC motor driver. The motor operations are directly set by the inputs LPWM, LDIR.

The device also include a circuit for early thermal alarm, last thermal alarm and thermal shutdown with hysteresis. The output of this stage is an open drain, kept ON during normal operations.

The THERM signal follows the inverted FSTART signal between early warning and last warning temperature, and remains in high impedance (OFF) after last warning temperature and during thermal shutdown.

THERMAL SHUTDOWN

UNDERVOLTAGE ON VCC SUPPLY

EXTERNAL SIGNAL FSTART;

This state is imposed automatically after a defined time-out.

The time-out is realized by sensing the falling edges of the FSTART signal; if no edges are recorded for a time interval greater than a certain time constant, the STANDBY condition is generated.

The time constant is defined by the external capacitor CTO.

In the STANDBY state the main functions (upper power stages, opto decoder, etc) of the device are turned off, in order to minimize the power consumption.

The device also implement an HEATER function. The HEATER transistor is OFF during thermal shutdown, undervoltage condition and during normal working mode.

The HEATER transistor is driven ON when the external STANDBY condition is present, according to the following table:

| FSTART | HIGH | LOW |
|---|---|---|
| HEATER | OFF | ON |

During the ON condition, the specified heater Ron is not guaranteed if all the voltage supplies are not at their minimum nominal value.

Of course, the specific details given above are merely illustrative, and may be widely modified and varied. While the disclosed inventions are particularly advantageous in smart power integrated circuits (where the power transistors are parts of the integrated structure), they are not by any means limited to such embodiments. Similarly, while the disclosed inventions are particularly advantageous in motor driver circuits, they are not by any means limited to such embodiments. Similarly, while the disclosed inventions are particularly advantageous in quasi-complementary half-bridge stages (where two transistors of the same conductivity type are used as pull-up and pull-down drivers) they are not by any means limited to such embodiments.

Other variations within the circuit are also possible. For example, the decoupling transistor may be an insulated-gate field-effect transistor.

What is claimed is:

1. An integrated driver circuit for driving an N-channel power field-effect transistor which is connected between an output node and a first positive supply voltage, comprising:

a switchable current source connected between the gate of said first transistor and a second positive supply voltage which is higher than said first positive supply voltage, and a switchable current sink connected between the gate of said first transistor and a supply reference voltage;

a string of components, connected to each other at a plurality of nodes, and connected to provide voltage-limiting between the gate of said first transistor and said output node; and at least one decoupling transistor having a control terminal connected to said output node, a first current-carrying terminal functionally connected to said second positive supply voltage, and a second current-carrying terminal connected to a first node of said string which is not said output node.

2. The integrated circuit of claim 1, wherein said decoupling transistor is bipolar.

3. The integrated circuit of claim 1, further comprising an additional transistor having a first current-carrying terminal thereof connected to said first current-carrying terminal of said decoupling transistor, a control terminal thereof connected to said second current-carrying terminal of said decoupling transistor, and a second current-carrying terminal thereof connected to a second node of said string which is not said first node nor said output node.

4. The integrated circuit of claim 1, wherein said decoupling transistor is an insulated-gate field-effect transistor.

5. The integrated circuit of claim 1, wherein said second current-carrying terminal of said decoupling transistor is connected to an intermediate node within said string.

6. The integrated circuit of claim 1, wherein said string comprises at least one pair of back-to-back Zener diodes.

7. The integrated circuit of claim 1, wherein said string consists of a single pair of back-to-back Zener diodes.

8. The integrated circuit of claim 1, wherein said string comprises at least one pair of back-to-back Zener diodes, and said decoupling transistor is merged with at least one of said Zener diodes.

9. The integrated circuit of claim 1, wherein said supply reference voltage is the ground potential of the integrated circuit.

10. An integrated motor driver circuit, comprising:

a first N-channel power field-effect transistor connected between an output node and a first positive supply voltage, and a second N-channel power field-effect transistor connected between said output node and supply reference voltage;

a switchable current source connected between the gate of said first transistor and a second positive supply voltage which is higher than said first positive supply voltage, and a switchable current sink connected between the gate of said first transistor and said supply reference voltage;

a string of components, connected to each other at a plurality of nodes, and connected to provide voltage-limiting between the gate of said first transistor and said output node; and at least one decoupling transistor having a control terminal connected to said output node, a first current-carrying terminal functionally connected to said second positive supply voltage, and a second current-carrying terminal connected to a first node of said string which is not said output node.

11. The integrated circuit of claim 10, wherein said decoupling transistor is bipolar.

12. The integrated circuit of claim 10, wherein said decoupling transistor is an insulated-gate field-effect transistor.

13. The integrated circuit of claim 10, wherein said second current-carrying terminal of said decoupling transistor is connected to an intermediate node within said string.

14. The integrated circuit of claim 10, wherein said string comprises at least one pair of back-to-back Zener diodes.

15. The integrated circuit of claim 10, further comprising an additional transistor having a first current-carrying terminal thereof connected to said first current-carrying terminal of said decoupling transistor, a control terminal thereof connected to said second current-carrying terminal of said decoupling transistor, and a second current-carrying terminal thereof connected to a second node of said string which is not said first node nor said output node.

16. The integrated circuit of claim 10, wherein said string consists of a single pair of back-to-back Zener diodes.

17. The integrated circuit of claim 10, wherein said string comprises at least one pair of back-to-back Zener diodes, and said decoupling transistor is merged with at least one of said Zener diodes.

18. The integrated circuit of claim 10, wherein said supply reference voltage is the ground potential of the integrated circuit.

19. An integrated motor driver circuit, comprising:

a first N-channel power field-effect transistor connected between an output node and a first positive supply voltage, and a second N-channel power field-effect transistor connected between said output node and supply reference voltage;

a switchable current source connected between the gate of said first transistor and a second positive supply voltage which is higher than said first positive supply voltage, and a switchable current sink connected between the gate of said first transistor and said supply reference voltage;

a string of components connected to each other at a plurality of nodes, and connected to provide voltage-limiting between the gate of said first transistor and said output node; and at least one decoupling transistor having a control terminal connected to said output node, a first current-carrying terminal functionally connected, through a diode, to said first positive supply voltage, and a second current-carrying terminal connected to a first node of said string which is not said output node.

20. The integrated circuit of claim 19, wherein said decoupling transistor is bipolar.

21. The integrated circuit of claim 19, wherein said decoupling transistor is an insulated-gate field-effect transistor.

22. The integrated circuit of claim 19, wherein said second current-carrying terminal of said decoupling transistor is connected to an intermediate node within said string.

23. The integrated circuit of claim 19, wherein said decoupling transistor is an insulated-gate field-effect transistor.

24. The integrated circuit of claim 19, further comprising an additional transistor having a first current-carrying terminal thereof connected to said first current-carrying terminal of said decoupling transistor, a control terminal thereof connected to said second current-carrying terminal of said decoupling transistor, and a second current-carrying terminal thereof connected to a second node of said string which is not said first node nor said output node.

25. The integrated circuit of claim 19, wherein said string comprises at least one pair of back-to-back Zener diodes.

26. The integrated circuit of claim 19, wherein said string consists of a single pair of back-to-back Zener diodes.

27. The integrated circuit of claim 19, wherein said string comprises at least one pair of back-to-back Zener diodes, and said decoupling transistor is merged with at least one of said Zener diodes.

28. The integrated circuit of claim 19, wherein said supply reference voltage is the ground potential of the integrated circuit.

29. An integrated circuit for driving a power transistor which is connected between an output node and a first supply voltage having a control voltage which is necessary to turn on said power transistor if connected to the gate thereof, comprising:

a first switchable current generator connected between the gate of said power transistor and a second supply voltage which is more extreme than said first supply voltage, and a second switchable current generator connected between the gate of said power transistor and a supply reference voltage;

a string of components connected between the gate of said power transistor and said output node to provide voltage-limiting; and at least one decoupling transistor having a control terminal connected to said output node, a first current-carrying terminal functionally connected to one of said supply voltages, and a second current-carrying terminal connected to a first node of said string which is not said output node.

30. The integrated circuit of claim 29, wherein said decoupling transistor is bipolar.

31. The integrated circuit of claim 29, wherein said decoupling transistor is an insulated-gate field-effect transistor.

32. The integrated circuit of claim 29, further comprising an additional transistor having a first current-carrying terminal thereof connected to said first current-carrying terminal of said decoupling transistor, a control terminal thereof connected to said second current-carrying terminal of said decoupling transistor, and a second current-carrying terminal thereof connected to a second node of said string which is not said first node nor said output node.

33. The integrated circuit of claim 29, wherein said second current-carrying terminal of said decoupling transistor is connected to an intermediate node within said string.

34. The integrated circuit of claim 29, wherein said string comprises at least one pair of back-to-back Zener diodes.

35. The integrated circuit of claim 29, wherein said string consists of a single pair of back-to-back Zener diodes.

36. The integrated circuit of claim 29, wherein said string comprises at least one pair of back-to-back Zener diodes, and said decoupling transistor is merged with at least one of said Zener diodes.

37. The integrated circuit of claim 29, wherein said supply reference voltage is the ground potential of the integrated circuit.

38. A power stage, comprising:

a first transistor in common-source configuration;

a second transistor in common-drain configuration;

wherein said first and said second transistors are field-effect transistors;

said first transistor being connected at its drain to an output node of the power stage and said second transistor being connected at its source to an output node of the power stage, and driven alternatively into conduction by first and second control circuits coupled to their respective gate terminals;

said second transistor, connected in common-drain configuration, being driven with a driving voltage higher than the common voltage of the drain thereof; and at least one pair of back-to-back zener limiting diodes, connected between source and gate of said second transistor to limit the gate-source voltage thereof;

further comprising at least one circuit component connected to said output node and said at least one pair of back-to-back zener limiting diodes for limiting the current drawn from a load connected to said output node of the power stage when said first and second transistors are turned off and said pair of back-to-back zener limiting diodes is turned on.

39. A power stage according to claim 38, wherein said circuitry for limiting the current drawn from the load is provided by a third transistor, controlled by said output node of the power stage, and connected to supply a current drawn from said gate terminal of said second field effect transistor and absorbed by a current generator turning off said second transistor.

40. A power stage according to claim 39, wherein said third transistor is a bipolar NPN transistor, having a base connected to said output node of the power stage, an emitter connected to the intermediate connection node between said pair of zener limiting diodes, and a collector connected to said higher driving voltage.

41. A power stage according to claim 38, wherein said circuitry for limiting the current drawn from the load is provided by first and second NPN bipolar transistors connected in a Darlington configuration, having respective collectors thereof connected in common to said higher driving voltage, said first NPN bipolar transistor being controlled by said output node of the power stage, and wherein at least the one of said back-to-back zener limiting diode of said pair which is connected to said output node of the power stage is implemented as first and second zener diodes connected in series, having each a zener voltage which is equivalent to half a desired protection voltage for the gate-source junction of said first field effect transistor and being connected between emitter and base of said first and second NPN bipolar transistors respectively.

42. A power stage according to claim 39, wherein said third transistor is a field effect transistor having a source connected to said gate terminal of said second field effect transistor, and a drain connected, through a diode directly biased, to said common voltage of the drain of said second field effect transistor.

43. An integrated power stage according to claim 40, wherein said third transistor and the one of said back-to-back zener limiting diodes of said pair which is connected to said output node of the power stage are implemented as a composite integrated structure in which said zener diode is realized as a buried zener within a body region, containing an emitter diffusion and a base diffusion, of an epitaxial layer constituting a collector region of said third transistor.

44. An integrated circuit, comprising:

first and second transistors, which are power transistors, connected in series respectively between first and second supply terminals, and connected to alternatively drive a load connected to an output terminal common to said first and second transistors;

a driver circuit connected to control said first transistor at the gate thereof by means of first and second current signals respectively turning on and turning off said first transistor, said driver circuit driving said first transistor with a third supply voltage, provided by a third supply terminal and higher than the voltages at said first and second supply terminals;

a limiting circuit connected between the gate of said first transistor and said output terminal, to limit the voltage therebetween; and circuit components coupled to said output node, said limiting circuit and said third supply terminal, and connected to control the current drawn from the load through said output node, when said first and second transistors are turned off and said limiting circuit is turned on, and accordingly to provide an amplified current which augments said second current signal.

45. An integrated circuit according to claim 44, wherein said circuit components comprise at least a third transistor connected to be controlled by the voltage at said output node and to provide an amplified current to said driver circuit constituting said second current signal turning off said first transistor.

46. An integrated circuit according to claim 45, wherein said third transistor is a bipolar transistor powered at said third supply terminal.

47. An integrated circuit according to claim 45, wherein said third transistor is a field effect transistor powered at said first supply terminal, whereat said first transistor is connected.

48. An integrated circuit according to claim 44, wherein said circuit components comprise third and fourth bipolar transistors, in a Darlington configuration, and connected to be controlled by the voltage at said output node and to provide an amplified current to said logic circuit constituting said second current signal turning off said first power transistor, said third and fourth bipolar transistors being powered by said third supply terminal.

49. An integrated circuit according to claim 44, wherein said first and second transistors are field effect transistors.

50. An integrated circuit according to claim 44, wherein said limiting circuit comprises a pair of back to back zener diodes connected between the gate of said first transistor and said output terminal.

51. An integrated circuit according to claim 44, wherein said first and second supply terminals are respectively connected to a supply line and to a ground node.

52. An integrated circuit, comprising:

first and second power field effect transistors connected in series between first and second supply terminals, wherein the source of said first power field effect transistor is connected to said first supply terminal and the drain of said second power field effect transistor is connected to said second supply terminal, said first and second power field effect transistors being connected to alternatively drive a load connected to an output terminal, common to said first and second power field effect transistors;

a driver circuit connected to control said first power field effect transistor at the gate thereof by means of first and second current signals respectively turning on and turning off said first power field effect transistor, said driver circuit driving said first power field effect transistor with a third supply voltage higher than the voltage at said first and second supply terminals and provided by a third supply terminal;

first and second zener diodes connected back to back between the gate of said first power field effect transistor and said output terminal, to limit the voltage therebetween; and an amplifier stage connected to be controlled by said output node, and connected between said output node and said third supply terminal to supply the current which would otherwise be drawn from said output node through said zener diodes upon turnoff of said power transistors, and accordingly to provide an amplified current which augments said second current signal of said driver circuit.

53. An integrated circuit according to claim 52, wherein said amplifier stage is provided by a bipolar transistor connected to a node between said first and second zener diodes to provide said amplified current, said bipolar transistor being powered at said third supply terminal.

54. An integrated circuit according to claim 53, wherein said bipolar transistor is a NPN transistor.

55. An integrated circuit according to claim 53, wherein said amplifier stage comprises a field effect transistor connected to a node between said first zener diode and said driver circuit to provide said amplified current, said field effect transistor being powered at said first supply terminal, whereat said first power transistor is connected.

56. An integrated circuit according to claim 52, wherein said amplifier stage comprises first and second bipolar transistors being connected in a Darlington configuration, to be controlled by the voltage at said output node, and to be powered by said third supply terminal;

further comprising a third zener diode, connected between a base and an emitter of said second bipolar transistor and in series between said first and second zener diodes;

said second bipolar transistor providing said amplified current to a node between said third zener diode and said first zener diode.

57. An integrated circuit according to claim 56, wherein said first and third zener diodes have each a zener voltage equivalent to half the required protection voltage for the gate source junction of said first power field effect transistor.

58. An integrated circuit according to claim 52, wherein said amplifier stage has a large gain.

59. An integrated circuit according to claim 52, wherein said first and second supply terminals are respectively connected to a supply line and to a ground node.

60. An integrated circuit according to claim 53, wherein said first and second power field effect transistors are LDMOS n-channel, having W/L dimensions between 20,000 μm/4 μm and 40,000 μm/4 μm and wherein said bipolar NPN transistor has minimum dimensions.

61. A method for controlling the current drawn from a load to be driven alternatively by a pair of power transistors, comprising the steps of:

using respective control circuits to alternatively turn on said power transistors;

when both of said pair of power transistors are off, sensing the voltage at an output node between the load and the pair of power transistors; and forcing the current drawn by the load through an additional amplifier stage, which is isolated from the control nodes of said power transistors, directly from a power supply node, when said voltage at the output node has reached a threshold value corresponding to starting of the current flow from the load.

62. The method of claim 61, wherein the step of sensing the voltage is performed by a transistor having a control terminal connected to said output node and current-carrying terminals connected between a first supply voltage and a Zener diode.

63. The method of claim 61, wherein said amplifier stage has a large gain.

64. The method of claim 61, wherein the step of sensing the voltage is performed by a transistor having a control terminal connected to said output node and current-carrying terminals connected in series with a pair of back-to-back Zener diodes.

* * * * *